(12) United States Patent
Cha

(10) Patent No.: US 12,308,217 B2
(45) Date of Patent: May 20, 2025

(54) APPARATUS FOR PREVENTING CONTAMINATION OF SELF-PLASMA CHAMBER

(71) Applicant: NANOTECH INC., Gyeonggi-do (KR)

(72) Inventor: Dong Ho Cha, Gyeonggi-do (KR)

(73) Assignee: NANOTECH INC., Gyeonggi-do (KR)

( * ) Notice: Subject to any disclaimer, the term of this patent is extended or adjusted under 35 U.S.C. 154(b) by 0 days.

(21) Appl. No.: 18/634,508

(22) Filed: Apr. 12, 2024

(65) Prior Publication Data

US 2024/0258077 A1    Aug. 1, 2024

Related U.S. Application Data

(62) Division of application No. 16/646,408, filed as application No. PCT/KR2018/008999 on Aug. 7, 2018, now Pat. No. 11,990,320.

(30) Foreign Application Priority Data

Sep. 14, 2017    (KR) .................. 10-2017-0117900

(51) Int. Cl.
    *H01J 37/32*      (2006.01)
    *C23C 16/50*      (2006.01)

(52) U.S. Cl.
    CPC ........ *H01J 37/32504* (2013.01); *C23C 16/50* (2013.01); *H01J 37/32183* (2013.01); *H01J 37/32568* (2013.01); *H01J 37/32651* (2013.01); *H01J 37/32834* (2013.01);
    (Continued)

(58) Field of Classification Search
    CPC . C23C 16/4405; C23C 16/4412; C23C 16/50; H01J 37/32091; H01J 37/32183; H01J 37/32504; H01J 37/32541; H01J 37/32568; H01J 37/32596; H01J 37/32651; H01J 37/32798; H01J 37/32834; H01J 37/32844; H01J 37/32862;
    (Continued)

(56) References Cited

U.S. PATENT DOCUMENTS

| | | |
|---|---|---|
| 6,643,014 B2 | 11/2003 | Chevalier et al. |
| 6,867,859 B1 | 3/2005 | Powell |
| 9,390,900 B2 | 7/2016 | Sugiyama et al. |

(Continued)

FOREIGN PATENT DOCUMENTS

| | | |
|---|---|---|
| KR | 10-0905128 B1 | 6/2009 |
| KR | 10-1273922 B1 | 5/2013 |

(Continued)

OTHER PUBLICATIONS

International Search Report from corresponding International application No. PCT/KR2018/008999; dated Nov. 12, 2018 (2 pages).

*Primary Examiner* — Benjamin Kendall
(74) *Attorney, Agent, or Firm* — Mendelsohn Dunleavy, P.C.

(57) ABSTRACT

The present invention relates to a technology for increasing the reliability of measurement by preventing the contamination of a self-plasma chamber provided in order to monitor a deposition operation performed in a process chamber, and has a shielding means capable of preventing an inflow of negative electrode material, which is generated by a sputtering phenomenon, into a discharge chamber when a positive charge of plasma, which is generated in the self-plasma chamber, collides with a negative electrode.

7 Claims, 4 Drawing Sheets

(52) U.S. Cl.
CPC ... *H01J 2237/022* (2013.01); *H01J 2237/026* (2013.01); *H01J 2237/332* (2013.01)

(58) Field of Classification Search
CPC ........... H01J 37/32871; H01J 37/32972; H01J 2237/022; H01J 2237/026; H01L 21/67028
See application file for complete search history.

(56) References Cited

U.S. PATENT DOCUMENTS

| | | |
|---|---|---|
| 10,777,401 B2 | 9/2020 | Wolf |
| 2001/0031234 A1 | 10/2001 | Christodoulatos et al. |
| 2003/0007910 A1 | 1/2003 | Diamant Lazarovich et al. |
| 2006/0290925 A1 | 12/2006 | Nomine et al. |
| 2010/0224322 A1 | 9/2010 | Sui et al. |
| 2011/0222058 A1 | 9/2011 | Kim et al. |
| 2016/0049279 A1 | 2/2016 | Suh |
| 2018/0294198 A1 | 10/2018 | Cho et al. |

FOREIGN PATENT DOCUMENTS

| | | |
|---|---|---|
| KR | 10-1695748 B1 | 1/2017 |
| KR | 10-2017-0087587 A | 7/2017 |

APPARATUS FOR PREVENTING CONTAMINATION OF SELF-PLASMA CHAMBER

This is a divisional application of application Ser. No. 16/646,408, filed Mar. 11, 2020, and application Ser. No. 16/646,408 is a 371 of international application PCT/KR2018/008999 filed Aug. 7, 2018, and PCT/KR2018/008999 claims priority to Korean patent application no. 10-2017-0117900 filed Sep. 14, 2017. All of the above-described applications are herein incorporated by reference in their entireties.

TECHNICAL FIELD

The present invention relates to a technology related to deposition for forming a thin film on a substrate in order to produce a semiconductor. More particularly, the present invention relates to a technology for increasing the reliability of measurement by preventing the contamination of a self-plasma chamber provided in order to monitor a deposition operation performed in a process chamber.

This invention was made with Korean government support under Project No. 20022707 by MOTIE (Ministry of Trade, Industry and Energy) and KEIT (Korea Planning & Evaluation of Industrial Technology) under research project "Developed of self plasma chamber and 50amu grade mass spectrometer". The project was made by NANOTECH INC., a supervising institute, for the research period of Jan. 1, 2024 through Dec. 31, 2024.

BACKGROUND ART

With the miniaturization and high integration of electric or electronic for components, a technology manufacturing highly integrated device by repeatedly performing a process in which a thin film such as a semiconductor, a metal, or a oxide is formed on an upper layer of various kinds of substrates including a semiconductor wafer or a liquid crystal substrate and the thin film is partially etched is being actively researched.

As the process of forming the thin film, various physical and chemical deposition methods are used. Examples of various deposition methods include a sputtering deposition method, a pulse-laser deposition method (PLD), a metalorganic deposition method (MOD), a metal organic chemical vapor deposition method (MOCVD), a chemical vapor deposition method (CVD), a plasma-enhanced chemical vapor deposition method (PECVD), an atomic-layer deposition method (ALD), etc.

A plasma apparatus used in the deposition process essentially includes a process chamber that defines a reaction space for thin film deposition. The process chamber usually maintains a vacuum state, and a substrate for the thin film deposition and target material are located in the chamber.

Meanwhile, in order to improve a yield during the process of depositing the thin film of the semiconductor, accidents occurring during the process should be prevented. In order to prevent the malfunction of equipment, it is necessary to optimize the process by monitoring the state of the process in real time, taking measures such as the stoppage of the process when an abnormal state occurs, and thus reducing a defective rate.

To this end, conventionally, a self-plasma chamber connected to an exhaust pipe of a process chamber separately from the process chamber is provided, and a sensor unit is installed to monitor the state of the plasma process.

In this case, non-metallic process material such as carbon discharged from an exhaust pipe of the process chamber and metallic process material such as tungsten adhere to an inner wall of the self-plasma chamber and a window, thus causing contamination. Furthermore, the material causing the contamination changes the permittivity of the self-plasma chamber, thus affecting the plasma discharge or the characteristics of the chamber.

Since the plasma discharge in the self-plasma chamber is affected by internal contamination and the transmittance of the window of the self-plasma chamber is reduced, it is difficult to measure a signal using the self-plasma chamber. Thus, it is impossible to obtain a correct contamination measurement value, and even a normal state may be misjudged as an abnormal state. Furthermore, since the self-plasma chamber is rapidly contaminated, its lifespan is shortened.

As the related art for solving the problems, Korean Patent No. 10-0905128 entitled "Contamination preventing apparatus and method of self-plasma chamber" has been proposed.

The conventional apparatus for preventing the contamination of the self-plasma chamber is the contamination preventing apparatus of the self-plasma chamber that is connected to an exhaust pipe of a process chamber and introduces gas from the process chamber, thus defining a space in a plasma state. The apparatus includes an electromagnetic field generator that generates an electromagnetic field so that the contamination causing material introduced from the process chamber deviates from a straight path extending towards the window of the self-plasma chamber, and one or more shield walls each having in a central portion thereof a through hole so that an optical signal from the self-plasma chamber passes through the straight path and then reaches the window, thus preventing the contamination causing material deviated from the straight path by the generated electromagnetic field from reaching the window of the self-plasma chamber.

That is, as shown in FIG. 1, an electromagnetic field generator 120 connected to the self-plasma chamber 40 is provided, and includes a magnetic substance 110 to generate a magnetic field.

The contamination causing material is subjected to Lorentz force by the electromagnetic field generator 120 that generates a magnetic field, and thus deviates from the straight path directed towards the window.

The shield wall 130 is provided in the vicinity of the window. One or more shield walls are formed in layers, thus capturing the contamination causing material and reducing the contamination of the window.

In addition to the window of the self-plasma chamber being contaminated by the contamination causing material introduced from the process chamber, it is necessary to prevent contaminants from moving towards the window due to the plasma generated in the self-plasma chamber.

In order to perform an analysis using a spectrometer, the plasma is generated in the self-plasma chamber. In this case, while the positive charge of the plasma collides with a metallic material that becomes a negative electrode under any pressure and temperature conditions, a sputtering phenomenon occurs and the negative electrode material moves towards the window, thus causing the contamination.

In other words, the contaminant generated when the positive charge in the plasma collides with a connector serving as the negative electrode is mixed with the plasma, thus deteriorating the measurement reliability, and the contaminant reaches the window, thus contaminating the window.

DISCLOSURE

Technical Problem

The present invention has been made to solve the above-mentioned problems and difficulties and relates to an apparatus for preventing contamination of a self-plasma chamber, configured to prevent negative (ground) electrode material, which is caused by plasma generated in the self-plasma chamber, from moving towards a window.

Technical Solution

In order to accomplish the above object, the present invention provides an apparatus for preventing contamination of a self-plasma chamber connected to a branch pipe branching from an exhaust pipe of a process chamber to analyze components of gas generated from the process chamber, wherein a shielding means may be provided to prevent ground-electrode material, generated due to a sputtering phenomenon when a positive charge of the plasma generated from the self-plasma chamber collides with a ground electrode, from being introduced into the discharge chamber, and the shielding means may be installed adjacent to the ground electrode.

The self-plasma chamber may include a connector connected to the branch pipe, a flange being formed on one end of the connector to be connected to the branch pipe; a discharge chamber connected to the other end of the connector, and made of non-metallic material; a window provided on an end of the discharge chamber; and a plasma generating module provided to generate the plasma in the discharge chamber.

The shielding means may be a shield ring that is installed adjacent to an end of the connector, to which the discharge chamber is coupled, to protrude into the discharge chamber, and is made of non-metallic material.

The shield ring may have a circular shape, and a through hole forming a concentric axis with the discharge chamber may be formed in the shield ring.

The shield ring may include one shield ring or two or more shield rings that are successively formed.

The shield ring may include a plurality of shield rings having through holes of different diameters.

The shield ring may include a plurality of shield rings that have the through holes of different diameters and are successively formed while being spaced apart from each other, thus forming a single body type, or individual shield rings that have the through holes of different diameters and are mounted while being spaced apart from each other.

The discharge chamber may include a discharge area 1 connected to the connector; and a main discharge chamber extending from the discharge area 1, and having an outer diameter smaller than an outer diameter of the discharge area 1, with a stepped portion being formed on an end of the discharge area 1 connected to the main discharge chamber, wherein a metal ring may be mounted on the stepped portion, and the stepped portion may function as the shielding means.

The discharge chamber may include a discharge area 1 connected to the connector; and a main discharge chamber extending from the discharge area 1, and having an outer diameter smaller than an outer diameter of the discharge area 1, with a stepped portion being formed on an end of the discharge area 1 connected to the main discharge chamber, wherein a metal piece may be installed in the discharge area 1, and a baffle plate may be coupled to a surface facing the main discharge chamber, the baffle plate functioning as the shielding means.

The plasma generating module may include an electrode installed towards the window to be spaced apart from the shield ring, and a RF matching coil, wherein the electrode and the RF matching coil may be connected to each other, and a RF generator and the connector may share the ground electrode, so that the connector may serve as the ground electrode.

The plasma generating module may include an electrode provided on the main discharge chamber, a metal ring provided on the stepped portion, and a RF matching coil, and the electrode and the RF matching coil may be connected to each other, and the RF generator and the metal ring may be connected to each other while sharing the ground electrode.

The plasma generating module may include an electrode provided on the main discharge chamber, the metal piece provided on the discharge area 1, and a RF matching coil, and the electrode and the RF matching coil may be connected to each other, and the RF generator and the metal piece may be connected to each other while sharing the ground electrode.

A second shielding means may be installed in a space between the electrode and the window.

A second shielding means may be installed in a space between the electrode and the window.

Advantageous Effects

An apparatus for preventing contamination of a self-plasma chamber according to the present invention is configured to prevent contaminants, generated when a positive charge of plasma generated from a discharge chamber collides with a portion serving as a ground electrode, from moving towards a window, thus preventing an interior of a discharge chamber and the window from being contaminated and thereby lengthening measurement life and enhancing measurement reliability.

MODE FOR INVENTION

Hereinafter, an apparatus for preventing contamination of a self-plasma chamber according to the present invention will be described in greater detail. Reference is made to the accompanying drawings in order to help understand the technical idea of the invention. The description of drawings and preferred embodiments set forth herein illustrate one example based on the technical spirit of the present invention. It is pointed out that the technical scope of the present invention is not limited thereto.

Figure 1:
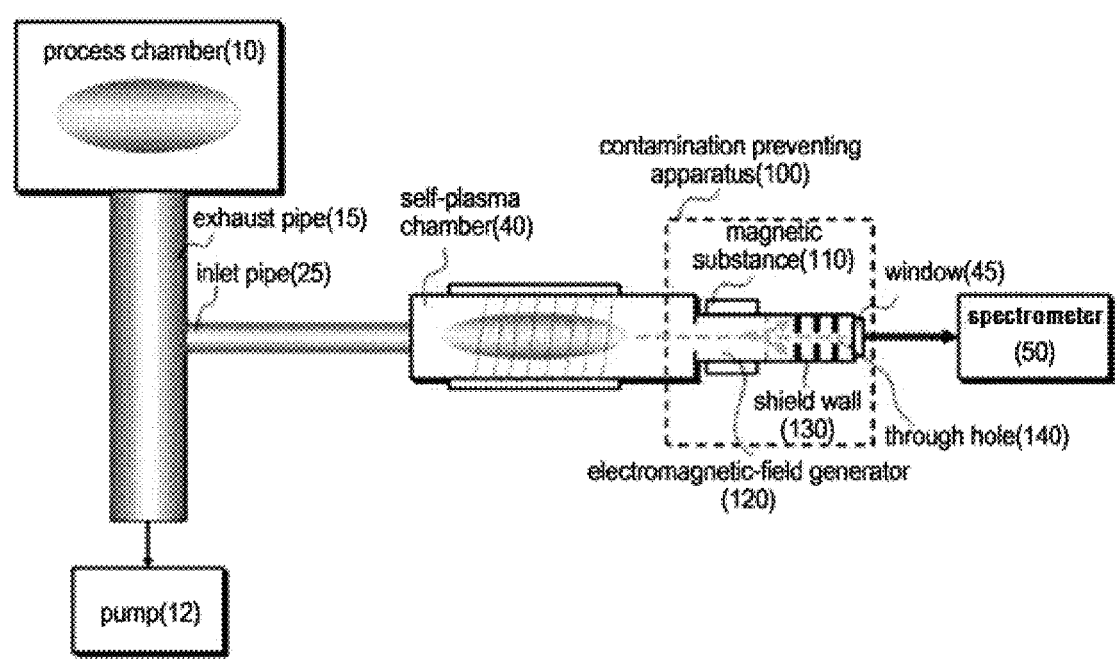
FIG. 1 is a conceptual diagram illustrating a conventional apparatus for preventing contamination of a self-plasma chamber.
Figure 2:
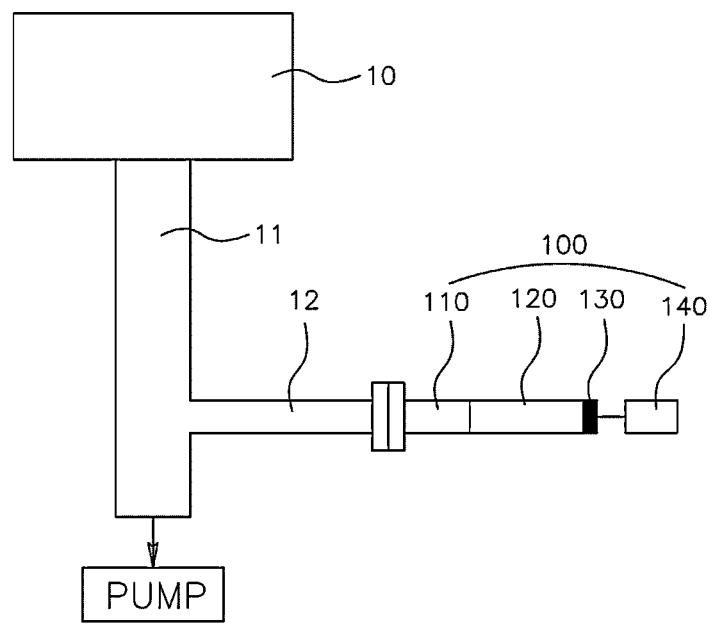
FIG. 2 is a conceptual diagram illustrating an apparatus for preventing contamination of a self-plasma chamber according to an embodiment of the present invention.
Figure 3:
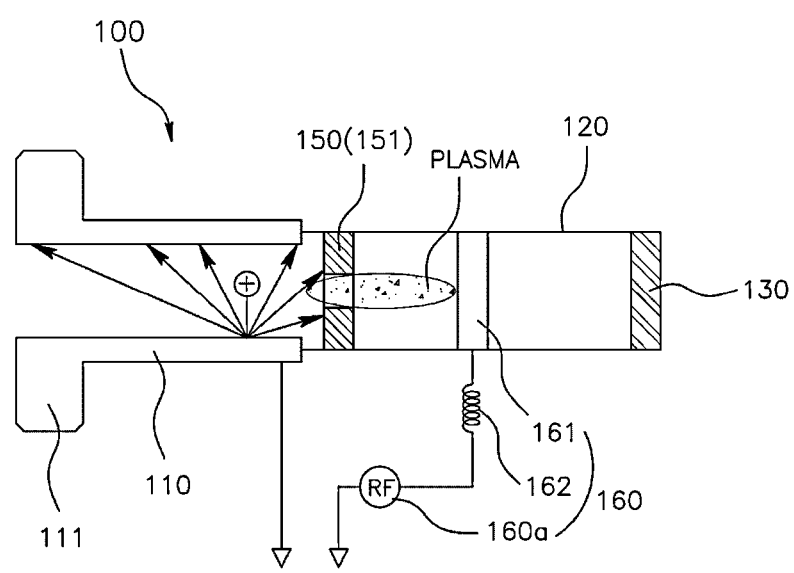
FIG. 3 is a diagram illustrating the configuration of an apparatus for preventing contamination of a self-plasma chamber according to a first embodiment of the present invention.
Figure 4:
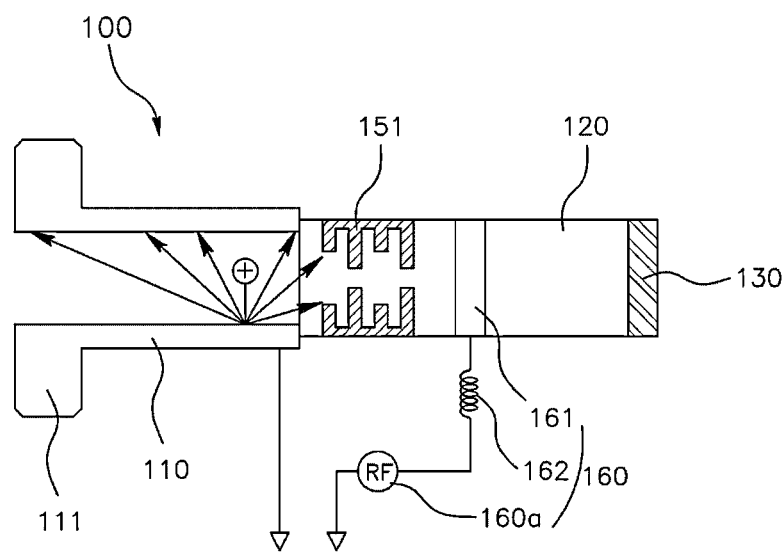
FIG. 4 is a diagram illustrating a modification of a shield ring used in the first embodiment.
Figure 5:
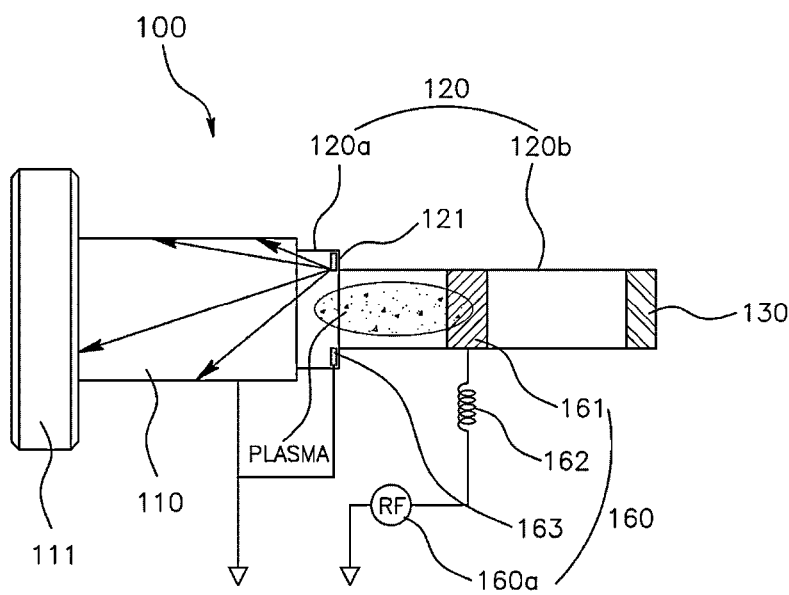
FIG. 5 diagram is a illustrating the configuration of an apparatus for preventing contamination of a self-plasma chamber according to a second embodiment of the present invention.
Figure 6:
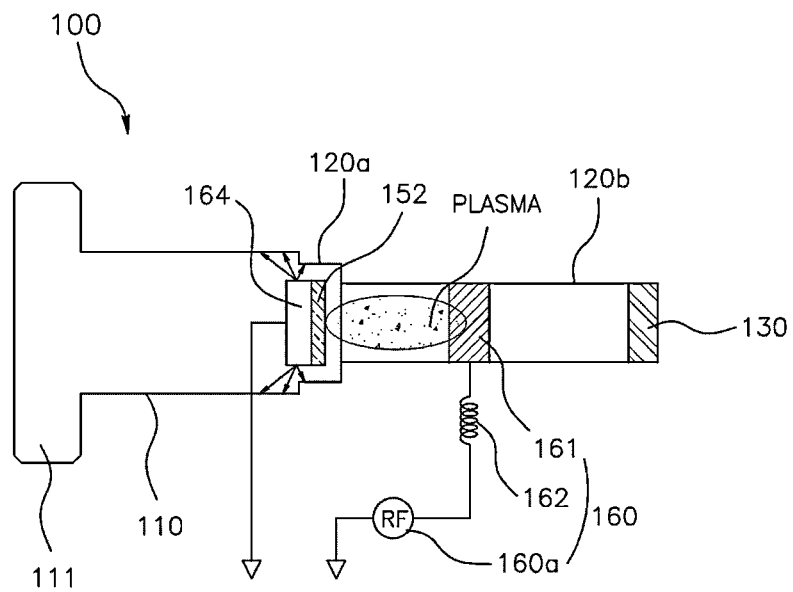
FIG. 6 is a diagram illustrating the configuration of an apparatus for preventing contamination of a self-plasma chamber according to a third embodiment of the present invention.

FIG. 2 is a conceptual diagram illustrating an apparatus for preventing contamination of a self-plasma chamber according to an embodiment of the present invention, FIG. 3 is a diagram illustrating the configuration of an apparatus for preventing contamination of a self-plasma chamber according to a first embodiment of the present invention, FIG. 4 is a diagram illustrating a modification of a shield ring used in the first embodiment, FIG. 5 is a diagram illustrating the configuration of an apparatus for preventing contamination of a self-plasma chamber according to a second embodiment, and FIG. 6 is a diagram illustrating the configuration of an apparatus for preventing contamination of a self-plasma chamber according to a third embodiment.

As shown in the drawings, the present invention relates to a self-plasma chamber. The self-plasma chamber is provided for the purpose of analyzing the components of gas generated in a process chamber for producing a semiconductor.

The self-plasma chamber 100 is connected to an exhaust pipe 11 of a process chamber 10, and connected to a branch pipe 12 branching from the exhaust pipe 11, so that some of the gas components discharged through the exhaust pipe 11 is made into a plasma state and then is analyzed using a spectrometer.

If the plasma is generated in the self-plasma chamber 100, the positive charge of the plasma collides with a ground electrode. At the time when temperature or pressure is met, ground-electrode material is released from the ground electrode of metal components due to a sputtering phenomenon. If the ground-electrode material is introduced into a discharge chamber 120, the ground-electrode material is attached to an inner wall of the discharge chamber 120 and the window 130, thus causing contamination. If the ground-electrode material is attached to the window 130, transmittance is reduced, so that accurate analysis may not be performed by a spectrometer 140. If the contaminant adheres to the inner wall of the discharge chamber 120, this interferes with the generation of the plasma.

Thus, according to the present invention, a shielding means 150 is provided so as to prevent the window 130 or the discharge chamber 120 from being contaminated due to the contaminant that is secondarily generated by the plasma generated in the self-plasma chamber 100.

To be more specific, the self-plasma chamber 100 includes the following basic components.

A connector 110 is provided. The connector 110 is connected to the branch pipe 12 branching from the exhaust pipe 11 of the process chamber 10, and a flange 111 is formed on the connector to be connected to one end of the branch pipe 12. The branch pipe 12 is a metal pipe, and the connector 110 is also a metallic pipe, with the flange 111 formed on one end of the connector. The branch pipe 12 and the connector 110 are hermetically connected to each other via the flange 111.

The discharge chamber 120 is connected to the other end of the connector 110, and the discharge chamber 120 is made of non-metallic material. The discharge chamber is typically made of material such as ceramic, sapphire, or glass. The discharge chamber 120 and the connector 110 are also hermetically connected to each other.

The window 130 is provided on an end of the discharge chamber 120, and is made of transparent sapphire or quartz through which plasma emitting light may pass.

A plasma generating module 160 is provided to generate the plasma in the discharge chamber 120. The plasma generating module 160 is supplied with electricity to temporarily generate the plasma.

The shielding means 150 may be installed adjacent to the connector 110 serving as the ground electrode to protrude into the discharge chamber 120, or the discharge chamber 120 may be formed in a stepped shape, thus allowing a shielding action to be realized due to the structural characteristics of the discharge chamber.

As the shielding means 150, according to the first embodiment of the present invention, as shown in FIG. 3, the shield ring 151 protruding into the discharge chamber 120 is formed adjacent to an end of the connector 110 to which the discharge chamber 120 is coupled. Particularly, the shield ring 151 is also made of non-metallic material.

Since the discharge chamber 120 may use a circular pipe, the shield ring 151 may have the shape of a circular ring. The shield ring is made of non-metallic material. For example, ceramic, quartz, sapphire etc. may be used.

Preferably, the shield ring 151 has a circular shape. A through hole 151a forming a concentric axis with the discharge chamber 120 is formed in the center of the shield ring.

Only one shield ring 151 may be used. As shown in FIG. 4, a plurality of shield rings 151 may be successively formed.

That is, two or more shield rings 151 may be successively formed. Through holes 151a of the shield rings 151 may have different diameters. According to this embodiment, two kinds of multiple shield rings 151 having the through holes 151a of different diameters may be used.

In the case of using the multiple shield rings 151, the shield rings may be integrated into a single body type. The shield rings 151 having the through holes 151a of different diameters may be successively and sequentially formed while being spaced apart from each other.

Alternatively, individual shield rings 151 having the through holes 151a of different diameters may be independently mounted while being spaced apart from each other.

As the shielding means 150, the shield ring 151 is installed adjacent to the connector 110. The plasma generating module 160 is provided. The plasma generating module 160 may include an electrode 161, a RF matching coil 162, and a RF generator 160a. Furthermore, the electrode 161 is spaced apart from the shield ring 151 and is installed outside the chamber towards the window 130.

The connector 110 acts as the ground electrode, the RF generator 160a is also grounded, and the RF matching coil 162 and the electrode 161 are connected to each other. That is, the RF generator 160a and the connector 110 share the ground electrode.

The RF generator 160a and the electrode 161 are connected via the RF matching coil 162. Further, the RF generator 160a and the connector 110 are connected via the ground electrode, and the discharge occurs by the supply of electricity, so that the plasma is generated in the discharge chamber 120.

When the plasma is generated, it collides towards a surface of the metallic connector 110 that acts as a negative potential electrode rather than the cation of the plasma. When conditions such as pressure are met, a sputtering phenomenon occurs and contaminants are generated from the connector 110.

The contaminants generated from the connector 110 are scattered. Due to the installation of the shield ring 151, the contaminants moving towards the discharge chamber 120 may be effectively prevented from being introduced into the discharge chamber 120 by the shield ring 151.

Particularly, if a plurality of shield rings 151 is formed, the inflow of the contaminants can be more efficiently prevented. Even if the contaminants pass through a passage of a first shield ring, the inflow of the contaminants can be prevented by a second shield ring. If the shield rings having the passages of different diameters are used, the contaminants can be more efficiently shielded.

Next, the second embodiment of the present invention will be described. FIG. 5 is a conceptual diagram illustrating the apparatus for preventing the contamination of the self-plasma chamber according to the second embodiment of the present invention.

The second embodiment is different from the first embodiment in that the discharge chamber 120 includes a discharge area 1 120*a* and a main discharge chamber 120*b*. The outer diameter of the discharge area 1 120*a* is larger than that of the main discharge chamber 120*b*.

The discharge area 1 120*a* is connected to the connector 110, and the main discharge chamber 120*b* extends from the discharge area 1 120*a*. Since the outer diameter of the main discharge chamber 120*b* extending from the discharge area 1 120*a* is small, a stepped portion 121 is formed on an end of the discharge area 1 120*a*.

A metal ring 163 is mounted on the stepped portion 121, and the stepped portion 121 functions as a shielding means 150. The metal ring 163 mounted on the stepped portion 121 is grounded like the connector.

The plasma generating module 160 of the second embodiment includes an electrode 161, a metal ring 163, a RF matcher 162, and a RF generator 160*a*. The electrode 161 is installed on an outer surface of the main discharge chamber 120*b* to act as an electrode, and the metal ring 163 installed on the stepped portion 121 acts as a ground electrode.

The electrode 161 and the RF matching coil 162 are connected to each other, and the RF generator 160*a* and the metal ring 163 are also connected to the ground electrode to generate the plasma by the discharge.

The plasma is generated in an area between the main discharge chamber 120*b* and the discharge area 1 120*a*. The positive charge of the plasma collides with the metal ring 163 acting as the ground electrode to release the ground-electrode material due to the sputtering phenomenon. However, since the metal ring 163 is mounted on the stepped portion 121, the contaminant released from the metal ring 163 moves towards the connector 110, so that the contaminant is not introduced into the discharge chamber 120.

In other according to words, the second embodiment, the shielding means 150 forms the stepped portion 121 that is the structural features of the discharge chamber 120, thus determining the direction of the contaminant released from the metal ring 163, and thereby preventing the discharge chamber 120 from being contaminated.

Next, the third embodiment of present invention will be described. FIG. 6 is a conceptual diagram of the third embodiment.

According to the third embodiment, the discharge chamber 120 includes the discharge area 1 120*a* and the main discharge chamber 120*b*. The discharge area 1 120*a* is connected to one end of the connector 110, the main discharge chamber 120*b* extends from the discharge area 1 120*a*, and the outer diameter of the discharge area 1 120*a* is larger than the outer diameter of the main discharge chamber 120*b*, so that the stepped portion 121 is formed on an end of the discharge area 1 120*a*.

Furthermore, according to the third embodiment, a baffle plate 152 is used as the shielding means 150. The baffle plate 152 is coupled to a surface of a metal piece 164 installed in the discharge area 1 120*a*, namely, a surface facing the main discharge chamber 120*b*.

According third embodiment, the baffle plate 152 functions as the shielding means 150.

The plasma generating module 160 includes an electrode 161, a metal piece 164, a RF matching coil 162, and a RF generator 160*a*. The electrode 161 is installed on the main discharge chamber 120*b*, and the metal piece 164 is disposed in a central portion of the discharge area 1 120*a*. The electrode 161 and a RF coil 162 are connected to each other, and the RF generator 160*a* shares the ground electrode.

If electricity is supplied, the plasma is generated by the plasma generating module 160, and the contaminant is released due to the sputtering phenomenon from the metal piece 164 acting as the ground electrode.

In this case, since the baffle plate 152 is coupled to a surface of the metal piece 164, the contaminant is released from a surface opposite to the surface on which the baffle plate 152 is installed, and the contaminant moves towards an opposite side of the discharge chamber 120.

Therefore, the baffle plate 152 functions as the effective shielding means 150, and a contamination source is not introduced into the discharge chamber 120, thus suppressing the contamination.

Next, a fourth embodiment of the present invention will be described.

The fourth embodiment of the present invention further includes a second shielding means 170 in addition to the components of the first, second, and third embodiments. That is, the fourth embodiment is configured such that the second shielding means 170 is further coupled to each of the first, second, and third embodiments.

Figure 7:
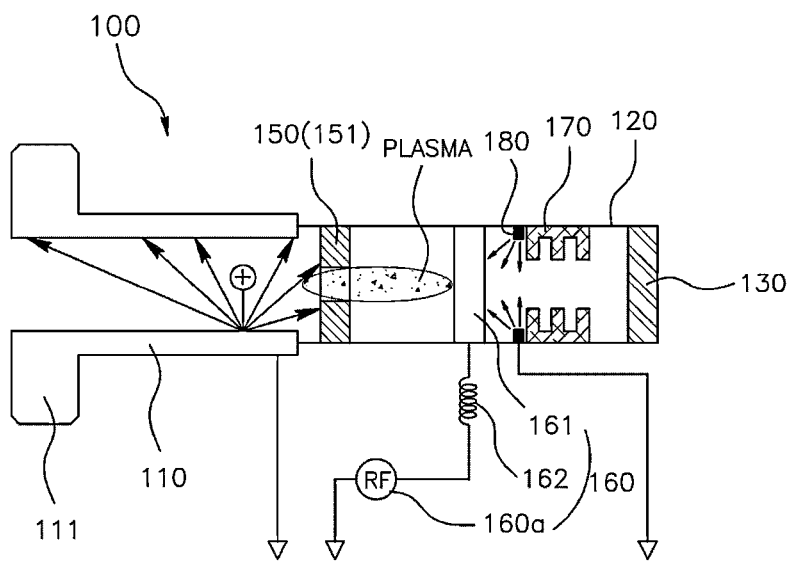
FIG. 7 is a diagram illustrating an example in which the second shielding means is mounted on the components of the first embodiment.

FIG. 7 is a diagram illustrating an example in which the second shielding means is mounted on the components of the first embodiment. The same second shielding means may be applied to the second embodiment or the third embodiment.

The second shielding means 170 may capture the contaminant moving towards the window 130, and may selectively use a corrosion-resistant material such as quartz or ceramic. In order to allow the contaminant moving towards the window 130 to be more smoothly captured by the second shielding means 170, it is necessary to change the moving path of the contaminant. To this end, an electromagnetic field generator 180 is provided in front of the second shielding means 170 so that the contaminant deviates from a straight path extending towards the window.

The electromagnetic field generator 180 includes a magnetic substance, and changes the contaminant moving path by generating the electromagnetic field. Thereby, the contaminant is caught by the second shielding means 170, thus significantly reducing a probability that the contaminant moves towards the window and consequently suppressing the contamination of the window 130.

The invention claimed is:

1. An apparatus comprising a self-plasma chamber comprising a shielding means, wherein the self-plasma chamber is connected to a branch pipe branching from an exhaust pipe of a process chamber to analyze components of gas generated from the process chamber,
wherein the shielding means prevents ground-electrode material, generated due to a sputtering phenomenon when a positive charge of the plasma generated from the self-plasma chamber collides with a ground electrode connector, from being introduced into a discharge chamber,
wherein the self-plasma chamber comprises:
the ground electrode connector connected to the branch pipe,
a flange formed on a one end of the ground electrode connector which is connected to the branch pipe, and
the discharge chamber connected to an other end of the ground electrode connector and made of non-metallic material, wherein the one end of the ground electrode connector is opposite to the other end of the ground electrode connector,
wherein the discharge chamber comprises:
a discharge area connected to the other end of the ground electrode connector;
a main discharge chamber extending from the discharge area, having an outer diameter smaller than an outer diameter of the discharge area, with a stepped portion being formed on an end of the discharge area connected to the main discharge chamber, and
wherein the shielding means is installed in the discharge area.

2. The apparatus of claim 1, wherein the shielding means is spaced apart from an inner surface of the discharge chamber.

3. The apparatus of claim 1, wherein the self-plasma chamber comprises:
a window provided on an end of the discharge chamber; and
a plasma generating module provided to generate the plasma in the discharge chamber.

4. The apparatus of claim 3, wherein a metal piece is installed in the discharge area, and a baffle plate is coupled to a surface facing the main discharge chamber, the baffle plate functioning as the shielding means.

5. The apparatus of claim 4, wherein the plasma generating module comprises an electrode provided in the main discharge chamber, the metal piece provided in the discharge area, and a RF matching coil, and the electrode and the RF matching coil are connected to each other, and the RF generator and the metal piece are connected to a ground electrode.

6. The apparatus of claim 5, wherein a second shielding means is installed in a space between the electrode and the window.

7. The apparatus of claim 6, wherein a shield ring is configured to protrude into the discharge chamber, and is made of non-metallic material, the shield ring functioning as the second shielding means.

* * * * *